(12) United States Patent
Fallah et al.

(10) Patent No.: US 7,447,101 B2
(45) Date of Patent: Nov. 4, 2008

(54) PG-GATED DATA RETENTION TECHNIQUE FOR REDUCING LEAKAGE IN MEMORY CELLS

(75) Inventors: Farzan Fallah, San Jose, CA (US); Behnam Amelifard, Los Angeles, CA (US); Massoud Pedram, Beverly Hills, CA (US)

(73) Assignees: Fujitsu Limited, Kawasaki (JP); University of Southern California, Los Angeles, CA (US)

( * ) Notice: Subject to any disclaimer, the term of this patent is extended or adjusted under 35 U.S.C. 154(b) by 0 days.

(21) Appl. No.: 11/615,422

(22) Filed: Dec. 22, 2006

(65) Prior Publication Data

US 2008/0151673 A1      Jun. 26, 2008

(51) Int. Cl.
G11C 5/14  (2006.01)
G11C 11/00  (2006.01)

(52) U.S. Cl. .................. 365/227; 365/154; 365/156; 365/226

(58) Field of Classification Search .................. 365/227
See application file for complete search history.

(56) References Cited

U.S. PATENT DOCUMENTS

| | | | | |
|---|---|---|---|---|
| 5,726,562 | A * | 3/1998 | Mizuno | 323/312 |
| 6,208,170 | B1 * | 3/2001 | Iwaki et al. | 326/121 |
| 6,515,513 | B2 * | 2/2003 | Ye et al. | 326/83 |
| 6,556,071 | B2 * | 4/2003 | Notani et al. | 327/544 |
| 7,055,007 | B2 * | 5/2006 | Flautner et al. | 711/156 |
| 7,164,616 | B2 * | 1/2007 | Miller et al. | 365/230.06 |
| 7,190,187 | B2 * | 3/2007 | Hua et al. | 326/27 |
| 7,298,663 | B2 * | 11/2007 | Houston et al. | 365/229 |
| 7,307,899 | B2 * | 12/2007 | Khellah et al. | 365/189.11 |
| 2004/0109344 | A1 * | 6/2004 | Yamauchi | 365/154 |
| 2005/0135162 | A1 * | 6/2005 | Somasekhar et al. | 365/189.06 |

OTHER PUBLICATIONS

A. Agarwal, et al., "DRG-Cache: A Data Retention Gated-Ground Cache for Low Power[1]," White Paper, School of Electrical and Computer Engineering, Purdue University, ACM 1-58113-461-4/02/0006, 6 pages, Jun. 10-14, 2001.

A. Agarwal, et al., "A Noise Tolerant Cache Design to Reduce Gate and Sub-threshold Leakage in the Nanometer Regime," White Paper, School of Electrical and Computer Engineering, Purdue University, ACM 1-58113-682-X/03/0008, ISLPED'03, 4 pages, Aug. 25-27, 2003.

(Continued)

*Primary Examiner*—Son L Mai
(74) *Attorney, Agent, or Firm*—Baker Botts L.L.P.

(57) ABSTRACT

A method of forming a memory cell includes coupling a first transistor between a supply rail of a memory cell and a node operable to accept a supply voltage. The method further includes coupling a second transistor between a ground rail of the cell and a node operable to accept a ground. In one embodiment, the method includes forming the cell to accept selectively applied external voltages, wherein the external voltages are selected to minimize leakage current in the cell. In another embodiment, the method includes forming at least one of the first and the second transistors to have a channel width and/or a threshold voltage selected to minimize a total leakage current in the cell.

35 Claims, 4 Drawing Sheets

OTHER PUBLICATIONS

B. Amelifard, et al., "Reducing the Sub-threshold and Gate-tunneling Leakage of SRAM Cells using Dual-$V_t$ and Dual-$T_{ox}$ Assignment," EDAA, 3-9810801-0-6/DATE06, 6 pages, © 2006.

N. Azizi, et al., "Low-Leakage Asymmetric-Cell SRAM," IEEE Transactions on Very Large Scale Integration (VLSI) Systems, 1063-8210/03, vol. 11, No. 4, 15 pages, Aug. 2003.

Y. Cao, et al., "New Paradigm of Predictive MOSFET and Interconnect Modeling for Early Circuit Simulation," White Paper, Department of Electrical Engineering and Computer Science, University of California at Berkeley, IEEE 2000 Custom Integrated Circuits Conference, 0-7803-5809-0/00, 4 pages, © 2000.

S. Cserveny, et al., "Locally Switched and Limited Source-Body Bias and Other Leakage Reduction Techniques for a Low-Power Embedded SRAM," IEEE Transactions on Circuits and Systems—II: Express Briefs, vol. 52, No. 10, 1057-7130, 5 pages, Oct. 2005.

K. Flautner, et al., "Drowsy Caches: Simple Techniques for Reducing Leakage Power," IEEE Computer Society, Proceedings of the 29th Annual International Symposium on Computer Architecture (ISCA'02), 1063-6897/02, 10 pages, © 2002.

C.H. Kim, et al., "Dynamic Vt SRAM: A Leakage Tolerant Cache Memory for Low Voltage Microprocessors," White Paper, Department of Electrical and Computer Engineering, Purdue University, ISLPED'02, ACM 1-58113-475-4/02/0008, 4 pages, Aug. 12-14, 2002.

C.H. Kim, et al., "A Forward Body-Biased Low-Leakage SRAM Cache: Device and Architecture Considerations," White Paper, Department of Electrical and Computer Engineering, Purdue University, ISLPED'03, ACM 1-58113-682-X/03/0008, 4 pages, Aug. 25-27, 2003.

C.H. Kim, et al., "PVT-Aware Leakage Reduction for On-Die Caches with Improved Read Stability," 2005 IEEE International Solid-State Circuits Conference, 0-7803-8904-2/05, 3 pages, © 2005.

D. Lee, et al., "Gate Oxide Leakage Current Analysis and Reduction for VLSI Circuits," IEEE Transactions on Very Large Scale Integration (VLSI) Systems, 1063-8210/04, vol. 12, No. 2, 12 pages, Feb. 2004.

C. Molina, et al., "Non Redundant Data Cache," White Paper, ISLPED'03, ACM 1-58113-682-X/03/0008, 4 pages, Aug. 25-27, 2003.

S. Mukhopadhyay, et al., "Modeling of Failure Probability and Statistical Design of SRAM Array for Yield Enhancement in Nanoscaled CMOS," IEEE Transactions on Computer-Aided Design of Integrated Circuits and Systems, vol. 24, No. 12, 0278-0070, 22 pages, Dec. 2005.

M. Pedram, et al., "Design Considerations for Battery-Powered Electronics," White Paper, Department of Electrical Engineering-Systems, University of Southern California, ACM 1-58113-109-7/99/06, 6 pages, © 1999.

M. Powell, et al., "Gated $V_{dd}$: A Circuit Technique to Reduce Leakage in Deep-Submicron Cache Memories," White Paper, School of Electrical and Computer Engineering, Purdue University, ISLPED'00, ACM 1-58113-190-9/00/0007, 6 pages, © 2000.

H. Qin, et al., "SRAM Leakage Suppression by Minimizing Standby Supply Voltage," Department of EECS, University of California at Berkeley, IEEE Computer Society, 0-7695-2093-6/04, 6 pages, © 2004.

E. Seevinck, et al., "Static-Noise Margin Analysis of MOS SRAM Cells," IEEE Journal of Solid-State Circuits, vol. SC-22, No. 5, 0018-9200/87/1000-0748, 7 pages, Oct. 1987.

T. Šimunic, et al., "Cycle-Accurate Simulation of Energy Consumption in Embedded Systems," White Paper, Computer Systems Lab, Stanford University, ACM 1-58113-092-9/99/0006, 6 pages, © 1999.

K. Zhang, et al., "SRAM Design on 65-nm CMOS Technology With Dynamic Sleep Transistor for Leakage Reduction," IEEE Journal of Solid-State Circuits, vol. 40, No. 4, 0018-9200, 7 pages, Apr. 2005.

V. De, et al., "Techniques for leakage power reduction," in Design of High-Performance Microprocessor Circuits, IEEE Press, ISBN 0-7803-3459-0, pp. 46-62, Book © 2001.

Y. Taur, et al., "Fundamentals of Modern VLSI Devices," Cambridge University Press, pp. 200-202, © 1998.

Website Page, "Predictive Technology Model (PTM)," PTM-Introduction, www.eas.asu.edu/~ptm/introduction.html, 1 page, Printed May 9, 2007.

* cited by examiner

PG-GATED DATA RETENTION TECHNIQUE FOR REDUCING LEAKAGE IN MEMORY CELLS

TECHNICAL FIELD

This invention relates generally to digital chips and more particularly to reducing leakage power dissipation.

OVERVIEW

Designers of VLSI (very-large-scale integration) circuits, including SRAM (static random access memory) and other memory cells, desire to limit subthreshold and gate tunneling leakage currents. Reducing these currents can help to minimize the leakage power consumption in these circuits. Some techniques use a footer sleep transistor to disconnect, for example, a memory cell from the ground. Other techniques may use a header sleep transistor to disconnect the cell from the power supply. Existing technologies, however, have not specifically designed external voltages applied to the memory cell and/or the physical characteristics of the sleep transistors to minimize leakage.

SUMMARY OF EXAMPLE EMBODIMENTS

In one embodiment, a method of forming a memory cell comprises coupling a first transistor between a supply rail of the memory cell and a node operable to accept a supply voltage. The method also comprises coupling a second transistor between a ground rail of the cell and a node operable to accept a ground. According to one embodiment of this method, at least one of the first and second transistors is formed to have a channel width or length, a threshold voltage, or a gate oxide thickness selected to minimize a total leakage current in the cell. In another embodiment of this method, one or more external voltages can be applied to the supply rail and/or the ground rail, wherein the external voltages are selected to minimize leakage current in the cell.

In another embodiment, a PG-gated memory cell comprises a first transistor coupled between a supply voltage and a supply rail of the cell, and a second transistor coupled between a ground and a ground rail of the cell. A virtual supply voltage resides at the supply rail and a virtual ground voltage resides at the ground rail. A value of a voltage difference between the supply rail and the ground rail is established, wherein the voltage difference is equal to a difference between the virtual supply voltage and the virtual ground voltage. Values of the virtual ground voltage and the virtual supply voltage are determined such that a total leakage current for the cell is minimized. In one particular embodiment, at least one of a channel width or length, a threshold voltage, or a gate oxide thickness of the first or the second transistor is determined, based at least in part on the determined values of the virtual supply voltage and the virtual ground voltage. In another embodiment, values of external voltages applied to the supply rail and the ground rail may be selected to minimize leakage for a given sleep transistor design.

In yet another embodiment, a PG-gated memory cell comprises a first sleep transistor coupled between a supply rail of a memory cell and a node operable to accept a supply voltage. A second sleep transistor is coupled between a ground rail of the cell and a node operable to accept a ground. In one embodiment, at least one of the first and the second sleep transistors comprises a channel width or length, a threshold voltage, or a gate oxide thickness selected to minimize a total leakage current in the cell. In another embodiment, a first external voltage is selectively applied to the supply rail and a second external voltage is selectively applied to the ground rail, wherein the first and second external voltages are selected to minimize the leakage current of the memory cell.

Depending on the specific features implemented, particular embodiments of the present invention may exhibit some, none, or all of the following technical advantages. For example, various embodiments may be capable of minimizing the current leakage of the memory cell subject to a hold static noise margin constraint. Some embodiments may be able to reduce power consumption compared to designs that use only one of a header or footer sleep transistor. Other embodiments may be capable of reducing the standard deviation of the leakage power consumption, or may have a lower sensitivity to temperature variations compared to previous designs.

BRIEF DESCRIPTION OF THE DRAWINGS

For a more complete understanding of the present disclosure and potential advantages of various example embodiments, reference is now made to the following description, taken in conjunction with the accompanying drawings, in which.

DETAILED DESCRIPTION OF EXAMPLE EMBODIMENTS

Figure 1:
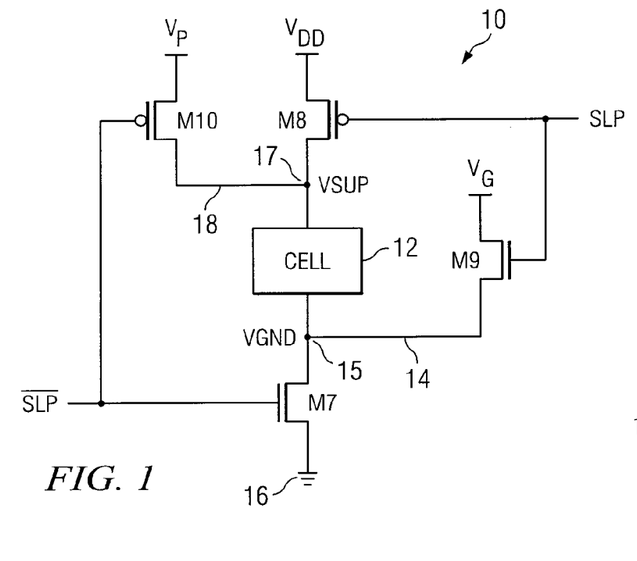
FIG. 1 illustrates a PG-gated memory cell, in this example an SRAM cell, which uses both an NMOS and a PMOS sleep transistor, as well as a first and a second external voltage selectively applied to minimize leakage current in the circuit.

FIG. 1 shows an example of a PG-gated cell structure 10 having external voltages $V_P$ and $V_G$, which can be selectively applied to a cell 10 to minimize leakage current in the circuit. In this example, cell structure 10 includes a memory cell 12. Although this embodiment uses a cell as an example of circuitry for which leakage current is to be minimized, other circuit structures could replace or augment cell 12 consistent with this disclosure. For example, other memory cells such as flip flops, latches, or other memory structures could replace and/or augment cell 12 consistent with this disclosure.

In this particular embodiment, memory cell 12 resides between a ground rail 14 and a supply rail 18. Ground rail 14 couples to a ground 16, and supply rail couples to a supply voltage $V_{DD}$. Throughout this disclosure, the term "couple" refers to a direct or indirect communication between two or more elements said to be "coupled" to one another. Ground 16 may be an actual ground, or may be a voltage selected relative to supply voltage $V_{DD}$. In any event, there exists a voltage differential between supply voltage $V_{DD}$ and ground 16.

In this example, a sleep transistor M7 couples between cell 12 and ground 16, such that a virtual ground voltage $V_{GND}$ exists at a virtual ground node 15 between cell 12 and sleep transistor M7. Sleep transistor M7 may comprise, for example, an NMOS transistor. Also in this embodiment, a sleep transistor M8 couples between cell 12 and supply voltage $V_{DD}$ such that a virtual supply voltage $V_{SUP}$ exists at a virtual supply node 17 between sleep transistor M8 and SRAM cell 12. Sleep transistor M8 may comprise, for example, a PMOS transistor.

In this embodiment, a strapping transistor M9 couples between the virtual ground node 15 and an external supply voltage $V_G$. When turned on, strapping transistor M9 sets the virtual voltage $V_{GND}$ at virtual ground node 15 approximately equal to $V_G$. The example shown in FIG. 1 further includes a strapping transistor M10 coupled between virtual supply node 17 and an external supply voltage $V_P$. When turned on, strapping transistor M10 sets the virtual supply voltage $V_{SUP}$ at virtual supply node 17 approximately equal to the voltage $V_P$.

In this example, an address decoder $\overline{SLP}$ couples to sleeping transistor M7 and strapping transistor M10. Similarly an address decoder SLP couples to sleeping transistor M8 and strapping transistor M9. Address decoders $\overline{SLP}$ and SLP can be used to control the read or write operations of the cell.

Given this circuit configuration, there exists a voltage difference between $V_{SUP}$ and $V_{GND}$ (and, accordingly between $V_P$ and $V_G$, where these external voltages are used) that can be represented by a quantity $\Delta V$. Having a smaller $\Delta V$ in the standby mode can result in lower leakage current for the cell. However, this also makes the cell more susceptible to noise. The hold static noise margin (SNM) on the SRAM cell is a function of this voltage difference. Typical SRAM cells (and other cells) will generally have values of $\Delta V$ desired for their operation. The embodiment shown in FIG. 1 accepts as a starting point a given value of $\Delta V$ desired for the cell's operation. Given this value, values for $V_{SUP}$ and $V_{GND}$ (and accordingly for $V_P$ and $V_G$, where these external voltages are used) are determined, which result in reduction or minimization of leakage current for the cell. Particular example techniques for making these determinations are discussed further below.

Figure 2:
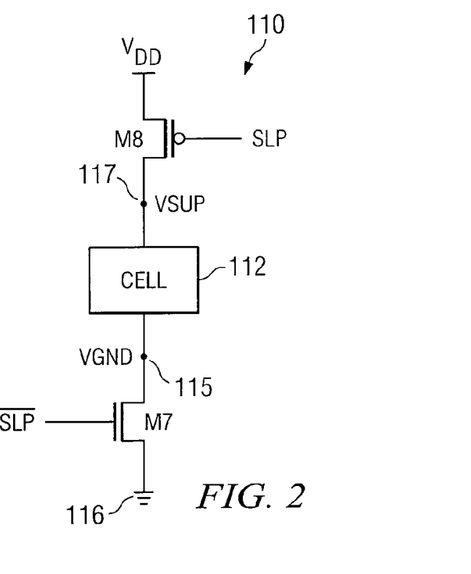
FIG. 2 illustrates a PG-gated memory cell, in this example an SRAM cell, which uses both an NMOS and a PMOS sleep transistor, at least one of which has one or more design characteristics selected to minimize leakage current in the cell.

FIG. 2 shows a PG-gated cell structure 110 using sleep transistors M7 and M8, which have been designed to minimize leakage current in the circuit. Cell structure 110 is similar in structure and operation to memory cell 10 shown in FIG. 1, but eliminates strapping transistors M9 and M10 as well as external voltages $V_G$ and $V_P$. To determine the design characteristics of sleep transistors M7 and M8 in this embodiment, as a particular example, after determining values of the virtual ground $V_{GND}$ and virtual supply $V_{SUP}$ voltages for a given voltage differential $\Delta V$, the technique described in this disclosure specifies one or more design characteristics of one or more of sleep transistors M7 and M8, that will correspond to the particular values of the determined virtual ground $V_{GND}$ and/or virtual supply $V_{SUP}$ voltages. For example, the channel widths of the sleep transistors and/or the threshold voltages of the sleep transistors can be selected according to the determined values of the virtual ground $V_{GND}$ and/or virtual supply $V_{SUP}$ voltages. In this manner, design characteristics of the sleep transistors in a PG gated cell (in addition to, or instead of the selection of external voltages $V_G$ and $V_P$) can be selected so as to minimize leakage current in the cell. In a particular embodiment, strapping transistors M9 and M10 and external voltages $V_G$ and $V_P$ (shown in FIG. 1, but eliminated in FIG. 2) can be eliminated. In that embodiment, the design characteristics of the sleep transistors M7 and M8 can be used as the primary control for leakage current in the memory cell 110. In yet another embodiment, selection of external voltages $V_G$ and/or $V_P$ as well as design characteristics of the sleep transistors can be used to control leakage current.

Figure 3:
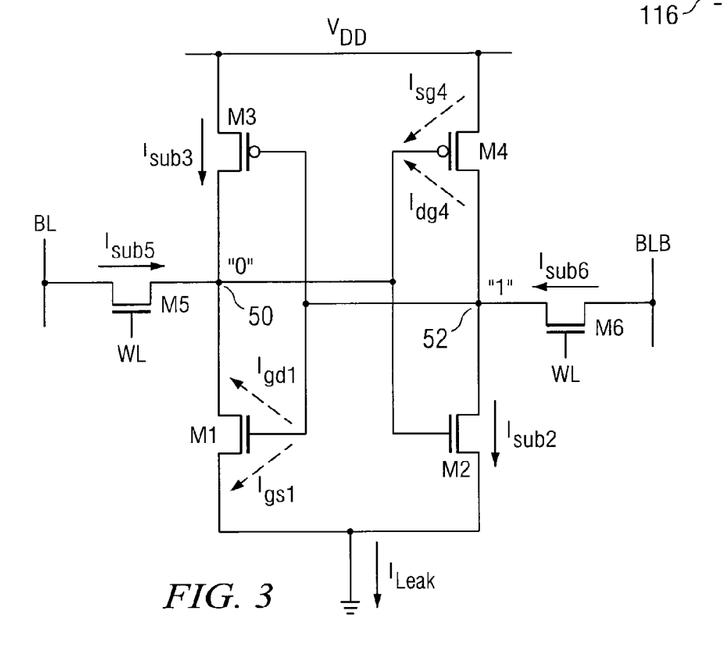
FIG. 3 illustrates the components of an example SRAM cell and the major leakage components when the cell is storing a logic 0.

To further illustrate specific examples of techniques for determining external voltages $V_G$ and $V_P$ and/or design characteristics of sleep transistors M7 and M8, FIG. 3 shows major leakage components of an example SRAM cell when it is storing a logic "0." This particular SRAM cell is comprised of six transistors. Four transistors, M1, M2, M3, and M4 are used as two cross-coupled inverters to hold the value of the bit, and two pass transistors M5 and M6 are the gateways of the SRAM for the read and write operations. While the pull-up PMOS transistors (M3 and M4) participate in the write operation, the pull-down NMOS transistors (M1 and M2) contribute in both read and write operations. Other SRAM cell (or other memory cell) designs could alternatively be used.

For analysis, we can assume that the left node 50 of the cell shown in FIG. 3 holds logic "0" while the right node 52 holds logic "1." Therefore, one can see that when the cell is not written or read, i.e., it is in the standby mode, the main components of leakage consumption in the SRAM cell are the currents shown in FIG. 3: (1) the bit-line (BL) and bit-line-bar (BLB) subthreshold leakage through the pass transistors M5 and M6 ($I_{sub5}$ and $I_{sub6}$); (2) the subthreshold leakage of the OFF NMOS transistor M2 and the OFF PMOS transistor M3 inside the cell ($I_{sub2}$ and $I_{sub3}$); and (3) and the gate-to-channel tunneling current of the ON transistors M1 and M4 ($I_{gd1}$, $I_{gs1}$, $I_{dg4}$, $I_{sg4}$). The total leakage current of the cell can be expressed as the summation of the above components:

$$I_{Leak} = I_{sub2} + I_{sub3} + I_{sub5} + I_{sub6} + I_{gd1} + I_{gs1} + I_{dg4} + I_{sg4}$$

As indicated above, for a desired value of $\Delta V$, there are values for $V_P$ and $V_G$ for which the leakage power dissipation of the cell is at a minimum. This example assumes the use of voltages $V_P$ and $V_G$. Alternatively, if these external voltages are not used, the values $V_{SUP}$ and $V_{GND}$ can be substituted into the following equations. For example, for each value of $\Delta V$, particular values of $V_P$ and $V_G$ can be found by minimizing the total leakage current of the cell. Minimizing this quantity results in the minimum leakage SRAM cell.

The problem of minimizing the leakage power consumption of the PG-gated SRAM cell can be expressed as:

$$\begin{cases} \min & P_{cell}(V_P, V_G) \\ s.t. & V_P - V_G = \Delta V \end{cases}$$

Since the difference of $V_P$ and $V_G$ is constant, to solve this problem the objective function can be expressed as the unconstrained minimization of $P_{Cell}(V_G + \Delta V, V_G)$. This problem can be solved, for example, by using unconstrained optimization techniques, such as the Newton-Raphson technique. As another example, the values of $V_P$ and $V_G$ can be determined by simulating the circuit for different values of $V_P$ and $V_G$ and finding the leakage using software, such as PSPICE. These techniques can identify values of $V_P$ and $V_G$ that minimize $P_{cell}$, the power consumption of the cell.

This analysis could consider the leakage currents of the additional circuitry used to create $V_P$ and $V_G$ as well. Other embodiments can accurately model the leakage power consumption of the PG-gated cell architecture while properly accounting for these factors. Certain embodiments can also account for the non-ideal efficiency of the DC-DC converters, which can be used to generate $V_P$ and $V_G$ from $V_{DD}$.

As a specific example of this type of modeling, the total leakage power consumption of a PG-gated SRAM cell in the standby mode can be expressed as:

$$P_{cell} = \frac{I_P V_P}{\delta_P} + \frac{I_G V_G}{\delta_G} + I_{dd} V_{dd}$$

where $\delta_P$ and $\delta_G$ are the efficiency of the DC-DC converters used to generate $V_P$ and $V_G$ from $V_{dd}$, respectively.

The total leakage current of the cell, which is a function of both $V_P$ and $V_G$, can be written as:

$$I_{Cell} = (I_{sub2} + I_{sub3} + I_{sub5} + I_{sub6}) + (I_{dg5} + I_{sg5} + I_{dg6} + I_{sg6}) + \sum_{i=1}^{4} I_{gate,i}$$

For any desired value of $\Delta V$, optimal values of $V_P$ and $V_G$ can be found by minimizing the $I_{Cell}$ equation subject to $V_P - V_G = \Delta V$.

The equation for $I_{Cell}$ includes factors that represent the leakage currents. The leakage current of a very deep submicron CMOS transistor consists of three components: (1) junction tunneling current, (2) subthreshold current, and (3) gate tunneling current. In present technologies the junction tunneling leakage is a minimal contributor to the total leakage current, so most analyses can concentrate on the subthreshold and gate tunneling leakage only. Subthreshold leakage is the drain-to-source current of a transistor when the gate-source voltage is less than the threshold voltage and the transistor is operating in the weak inversion region. Subthreshold leakage can be modeled as:

$$I_{sub} = A_{sub}\left(\frac{W}{L_{eff}}\right) e^{q(V_{gs} - V_{t0} - \gamma' V_{sb} + \eta V_{ds})/n'kT}(1 - e^{-qV_{ds}/kT})$$

where $A_{sub} = \mu_0 C_{ox}(kT/q)^2 e^{1.8}$, $\mu_0$ is the zero bias mobility, $C_{ox}$ is the gate oxide capacitance per unit area, W and $L_{eff}$ denote the width and effective length of the transistor, k is the Boltzmann constant, T is the absolute temperature, and q is the electrical charge of an electron. In addition, $V_{t0}$ is the zero biased threshold voltage, $\gamma'$ is the linearized body-effect coefficient, $\eta$ denotes the drain-induced barrier lowering (DIBL) coefficient, and n' is the subthreshold swing coefficient of the transistor.

The gate tunneling current is composed of three major components: (1) gate-to-source and gate-to-drain overlap current, (2) gate-to-channel current, part of which goes to the source and the rest goes to the drain, and (3) gate-to-substrate current. In bulk CMOS technology, the gate-to-substrate leakage current is several orders of magnitude lower than the overlap tunneling and gate-to-channel current. While the overlap tunneling current dominates the gate leakage in the OFF state, gate-to-channel tunneling dictates the gate current in the ON state. Since the gate to source and gate to drain overlap regions are much smaller than the channel region, the gate tunneling current in the OFF state is much smaller than the gate tunneling in the ON state. Based on this analysis, one can see that a major source of gate tunneling leakage in CMOS circuits is the gate-to-channel tunneling current of the ON transistors, which can be modeled as:

$$I_{ox} = A_{ox}\left(\frac{V_{ox}}{t_{ox}}\right)^2 e^{-B\frac{t_{ox}}{V_{ox}}}$$

where $A_{ox} = WL_{eff} A_c$. In these expressions, W and $L_{eff}$ denote the width and effective length of the transistor, $A_c$ and B are constants, $t_{ox}$ is the oxide thickness, and $V_{ox}$ is the voltage potential on the gate oxide.

Minimizing the $I_{Cell}$ equation results in the minimum leakage SRAM cell, but that analysis does not consider the leakage currents of the additional circuitry. Other embodiments can accurately model the leakage power consumption of the PG-gated cell architecture while properly accounting for these factors. As mentioned above, certain embodiments can also account for the non-ideal efficiency of the DC-DC converters that can be used to generate $V_G$ and $V_P$ from $V_{dd}$. One way to do this is to start by deriving the current drawn from each power supply. By utilizing Kirchhoff's Current Law, the current flow from the source to drain of strapping transistor M10 in FIG. 1 can be derived. The current drawn from the virtual supply node $V_P$ is simply $I_P = I_{sg10} + I_{sd10}$. Similarly, at the virtual ground node $V_G$ the current flow from drain to source of strapping transistor M9 can be derived. The current from this node is $I_G = I_{sd9} + I_{sg9}$. The current drawn from $V_{dd}$ can be expressed as:

$$I_{dd} = I_{sub8} + I_{gd8} + I_{sub5} + I_{dg5} + I_{sub6} + I_{dg6}$$

Using some or all of the above equations, the unconstrained minimization of $P_{Cell}(V_G + \Delta V, V_G)$ can now be solved for values of $V_P$ and $V_G$ (or alternatively, for values of $V_{SUP}$ and $V_{GND}$). Alternatively, or in addition, the channel width or the threshold voltage or both of the first or the second sleep transistor can be determined for specified values of $V_{SUP}$ and $V_{GND}$, based at least in part on these values, to minimize current leakage.

Certain embodiments can also account for random process or intra-die variations. A significant intra-die variation in memory cells is the threshold voltage variation due to random dopant fluctuation (RDF). In the presence of RDF, the threshold voltage of the memory cell transistors can be modeled as independent Gaussian random variables where the standard deviation of each transistor depends on its length and width as well as the manufacturing process. In other words:

$$\sigma = \sigma_{min}\sqrt{\frac{W_{min}L_{min}}{WL}}$$

where $\sigma$ is the standard deviation of the threshold voltage of a transistor with the channel length and width of L and W, and $\sigma_{min}$ is the standard deviation of the threshold voltage for the minimum sized transistor.

In one embodiment, to study the effect of the process variation on PG-gated and G-gated SRAM cells the threshold voltage of each transistor can be modeled as independent Gaussian random variables whose standard deviation is obtained from the equation for $\sigma$ above. Simulations such as a Monte Carlo simulation can then be performed to study this effect. Using these concepts, memory cells can be designed to minimize leakage variation of PG gated cells.

The power dissipation of the PG-gated SRAM cell can be expressed as:

$$P_{cell} = \frac{I_P V_P}{\delta_P} + \frac{I_G V_G}{\delta_G} + I_{dd} V_{dd}$$

In the following it is shown how to minimize the mean of the leakage power considering process variation. We consider three sources of variations: the variation in the number of dopants in the channel $N_{eff}$ (also known as random dopant fluctuation), the variation in the line width L, and the variation in the oxide thickness $T_{ox}$. These sources of variations are considered to be independent of each other and each distribution is assumed to be Gaussian.

To minimize the power consumption under these sources of variations, we assume that the $V_P$, $I_G$, and the efficiencies of the DC-DC converters are fixed and do not change with the process variation; hence, the mean of the leakage of the cell can be expressed as:

$$E[P_{cell}] = \frac{V_P}{\delta_P} E[I_P] + \frac{V_G}{\delta_G} E[I_G] + V_{dd} E[I_{dd}]$$

where E[x] is the mean of the random variable x. To obtain the mean of the leakage power consumption, it is enough to calculate $E[I_P]$, $E[I_G]$, and $E[I_{dd}]$. In the following we show how to compute $E[I_{dd}]$. Similar procedures can be used to obtain $E[I_P]$ and $E[I_G]$. $I_{dd}$ can be expressed as:

$$I_{dd} = I_{sub8} + I_{gd8} + I_{sub5} + I_{dg5} + I_{sub6} + I_{dg6}$$

So, $$E[I_{dd}] = E[I_{sub5}] + E[I_{sub6}] + E[I_{sub8}] + E[I_{dg5}] + E[I_{dg6}] + E[I_{gd8}]$$

Noticing the fact that the variation in $N_{eff}$, L, and $T_{ox}$ change both sub-threshold and gate-tunneling leakage currents, in the following we show how to calculate the mean of these leakage components.

First, notice that threshold voltage is related to these sources of variations with the following equations, $$V_t = V_{fb} + \varphi_{S0} - [2(V_{bi} - \phi_{S0}) + V_{ds}][e^{-L/2l_c} + 2e^{-L/l_c}] +$$

$$\gamma \sqrt{\phi_{S0} - V_{bs}} \left(1 - \frac{\lambda}{L} X_d\right) + V_{nce}$$

$$\phi_{S0} = 2v_T \ln\left(\frac{N_{eff}}{n_i}\right), X_d = \sqrt{\frac{2\varepsilon_{Si}}{qN_{eff}}(\phi_{S0} - V_{bs})},$$

$$\gamma = \sqrt{\frac{2q\varepsilon_{Si} N_{eff}}{\varepsilon_{ox}/T_{ox}}} \quad V_{bi} = v_T \ln\left(\frac{N_{sd} N_{eff}}{n_i^2}\right)$$

$$V_{nce} = 3\pi \frac{T_{ox}}{W}(\varphi_{S0} - [2(V_{bi} - \phi_{S0}) + V_{ds}][e^{-L/2l_c} + 2e^{-L/l_c}]),$$

$$l_c = \sqrt{\frac{\varepsilon_{Si}}{\varepsilon_{ox}} X_d}, v_T = \frac{KT}{q}$$

By linearly approximating the threshold voltage around the nominal values of $N_{eff}$, L, $T_{ox}$, it can be written as:

$$V_t(N_{eff}, T_{ox}, L) = \eta_{V_t} + \frac{\partial V_t}{\partial N_{eff}} \Delta N_{eff} + \frac{\partial V_t}{\partial T_{ox}} \Delta T_{ox} + \frac{\partial V_t}{\partial L} \Delta L$$

$$= \alpha_{eff} \Delta N_{eff} + \alpha_{T_{ox}} \Delta T_{ox} + \alpha_L \Delta L$$

where $$\eta_{V_t} = V_t(\eta_{N_{eff}}, \eta_{T_{ox}}, \eta_L)$$

Recalling the formula for sub-threshold leakage as:

$$I_{sub}(N_{eff}, T_{ox}, L) =$$

$$\mu_0 \frac{\varepsilon_0}{T_{ox}} \frac{W}{L_{eff}} v_T^2 e^{1.8} \exp(q(V_{gs} - V_t)/n'kT)(1 - \exp(-qV_{dd}/kT))$$

it can be seen that mean of the sub-threshold leakage in the presence of process variation can be obtained from, $$E[I_{sub}] = \mu_0 \varepsilon_0 W v_T^2 e^{1.8} \eta_{V_t} E\left[\exp(-\alpha_{N_{eff}} \Delta N_{eff} q/n'kT)\right] \times$$

$$E\left[\frac{1}{T_{ox}} \exp(-\alpha_{T_{ox}} \Delta T_{ox} q/n'kT)\right] \times E\left[\frac{1}{L} \exp(-\alpha_L \Delta L q/n'kT)\right]$$

The remaining step is to calculate the expected values in the right hand side of the $E[I_{sub}]$ equation above. This can be done by using Taylor series around the mean of the corresponding random variable. By recalling that the variations in $N_{eff}$, L, and $T_{ox}$ are Gaussian, odd moments of the distributions of each random variable are zero; hence, any function $f$ of such a random variable x can be approximated as:

$$E[f(x)] \approx f(\eta_x) + \frac{1}{2} \left.\frac{\partial^2 f}{\partial x^2}\right|_{\eta_x} \cdot \sigma_x^2$$

where $\eta_x$ and $\sigma_x$ are the mean and standard deviation of the random variable x.

By using the $E[f(x)]$ equation, the mean of the sub-threshold leakage can be calculated as a function of $V_G$ and $V_P$.

A similar procedure can be used to calculate the expected value of gate-tunneling leakage $I_{gate}(N_{eff}, T_{ox}, L)$ under process variation.

Having calculated the mean of each leakage component, the mean of $I_{dd}$ can be found as a function of $V_P$ and $V_G$. The mean of $I_P$ and $I_G$ can be found similarly. Having had $E[I_P]$, $E[I_G]$, and $E[I_{dd}]$, the mean of leakage power consumption of the cell, as a function of $V_P$ and $V_G$, can be obtained by using the $E[P_{cell}]$ equation; hence, the optimization problem to minimize the mean of the leakage of the cell becomes:

$$\begin{cases} \min & P_{cell}(V_P, V_G) \\ s.t. & V_P - V_G = \Delta V \end{cases}$$

which can be efficiently solved by using, for example, the Newton-Raphson technique.

Figure 4:
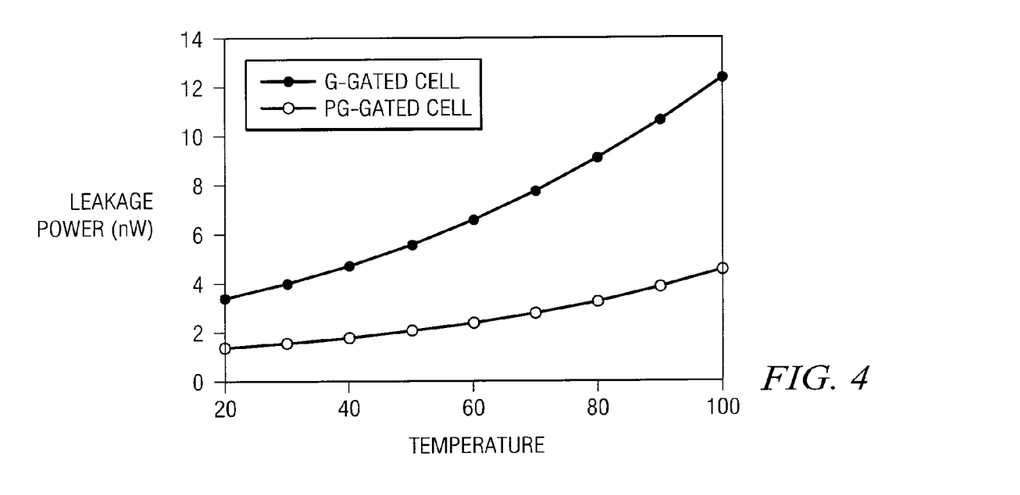
FIG. 4 shows an example of a reduction in leakage variation of PG-gated cells as a function of chip temperature.

The threshold voltage of a transistor is reduced with an increase in temperature, resulting in an exponential increase in the subthreshold leakage currents. Simulations can be performed to study the effect of temperature on SRAM gated cells. The results of one such simulation are shown in FIG. 4. FIG. 4 shows the leakage power as a function of temperature for a PG-gated and a G-gated cell. The PG-gated cell has much lower sensitivity to temperature variations compared to the G-gated cell. Using these concepts, memory cells can be designed to minimize leakage variation of PG-gated cells in light of chip temperatures.

Here it is assumed that the temperature variation follows a uniform distribution, having maximum value of $T_{max}$ and minimum value of $T_{min}$. To optimize the power consumption of the PG-gated memory cell under temperature variation, we choose to minimize the expected value of leakage under temperature variation. Variation in the temperature changes the threshold voltage and results in altering the leakage currents.

To obtain the mean of subthreshold current under temperature variation, we use the Taylor series around the mean of temperature, resulting in:

$$E[I_{sub}(T)] \approx I_{sub}(\eta_T) + \frac{\partial I_{sub}}{\partial T}\bigg|_{\eta_T} \times \sigma_T + \frac{1}{2}\frac{\partial^2 I_{sub}}{\partial T^2}\bigg|_{\eta_T} \times \sigma_T^2$$

A similar formula can be written for the expected value of gate-tunneling leakage under temperature variation.

Having had the equations for subthreshold and gate-tunneling leakage, the expected values of $I_{dd}$, $I_P$, and $I_G$ can be calculated, and by using the $E[P_{cell}]$ equation above the expected value of total leakage power dissipation can be obtained as a function of $V_G$ and $V_P$. By solving the $E[P_{cell}(V_P, V_G)]$ minimization shown above, the leakage power consumption of a PG-gated memory cell can be optimized under temperature variations.

Figure 5:
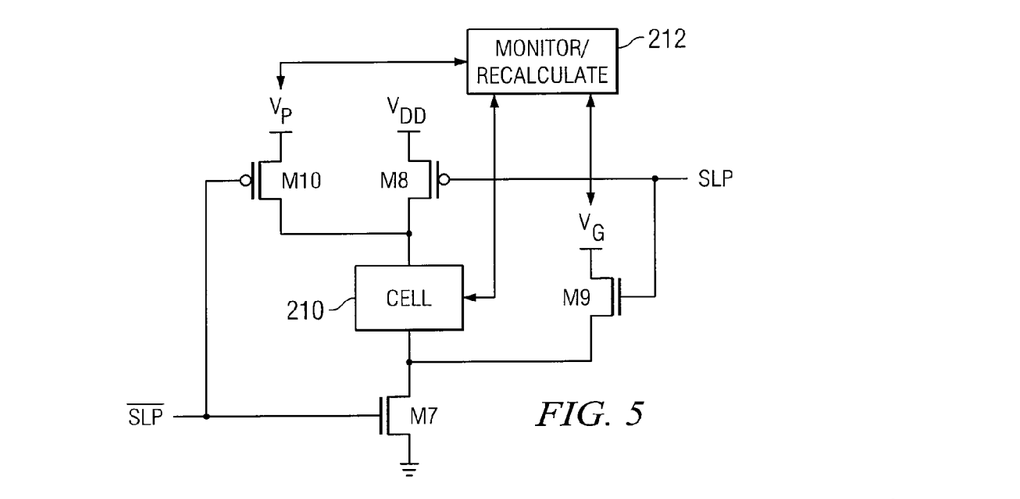
FIG. 5 illustrates an example of a feedback system operable to monitor various characteristics of the cell, make calculations, and adjust the values of the external voltages.

In some embodiments, the values of the virtual supply voltage $V_{SUP}$ and the virtual ground voltage $V_{GND}$ (and/or the values of the external voltages $V_P$ or $V_G$) can be varied dynamically during operation of the cell. This can be performed, for example, to continue to minimize leakage despite fluctuations in the operational characteristics of the cell. FIG. 5 shows and example configuration where a feedback system 212 could measure various operational characteristics of a cell 210 during operation, calculate the effects of changes or fluctuations of those characteristics on the cell, and adjust values of external voltages $V_G$ and/or $V_P$ to account for these changes.

Figure 6:
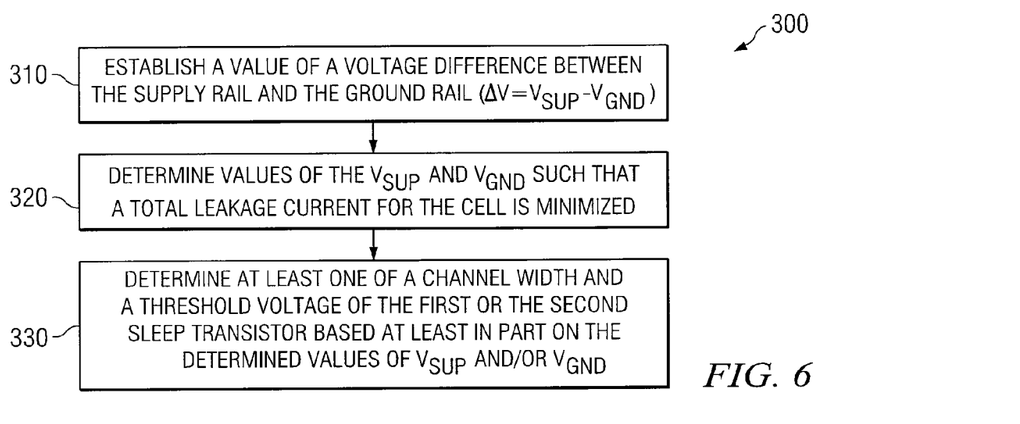
FIG. 6 is a flowchart illustrating one example of a method of forming a PG-gated SRAM cell using the characteristics of at least one of the sleep transistors.

FIG. 6 is a flowchart illustrating one example of a method of forming a PG-gated cell by selecting one or more design characteristics of at least one of the sleep transistors M7 and M8 to minimize leakage current in the circuit. The method 300 begins at step 310 where a desired value of a voltage difference between the supply rail 18 and the ground rail 14 is identified. The voltage difference ΔV is equal to the difference between the virtual supply 17 and the virtual ground voltage 15. At step 320, values of the virtual supply voltage 17 and the virtual ground voltage 15 are determined such that a total leakage current $I_{Leak}$ for the cell is minimized. In some embodiments this may be done, for example, using regular unconstrained optimization techniques, such as the Newton-Raphson technique. As another example, the voltage values can be determined using circuit modeling software, such as PSPICE. In particular embodiments, the method may further comprise selectively applying a first external voltage to the supply rail of the cell, wherein the first external voltage equals the desired value of the virtual supply voltage selected to minimize leakage current in the cell. A second external voltage may be applied to the ground rail of the cell, wherein the second external voltage equals the desired value of the virtual ground voltage selected to minimize leakage current in the cell. In another optional embodiment, at step 330, at least one characteristic of one or more of the sleep transistors M7 and/or M8 can be determined through its relationship to a particular virtual ground voltage 15 and/or virtual supply voltage 17 of the cell. As specific non-limiting examples, this may involve determination of a channel width and/or a threshold voltage of the first sleep transistor M7 or the second sleep transistor M8, based at least in part on the above-determined values of the virtual supply voltage 17 and/or the virtual ground voltage 15. In some embodiments, the values of the virtual supply and virtual ground voltages can be dynamically modified during device operation.

Figure 7A:
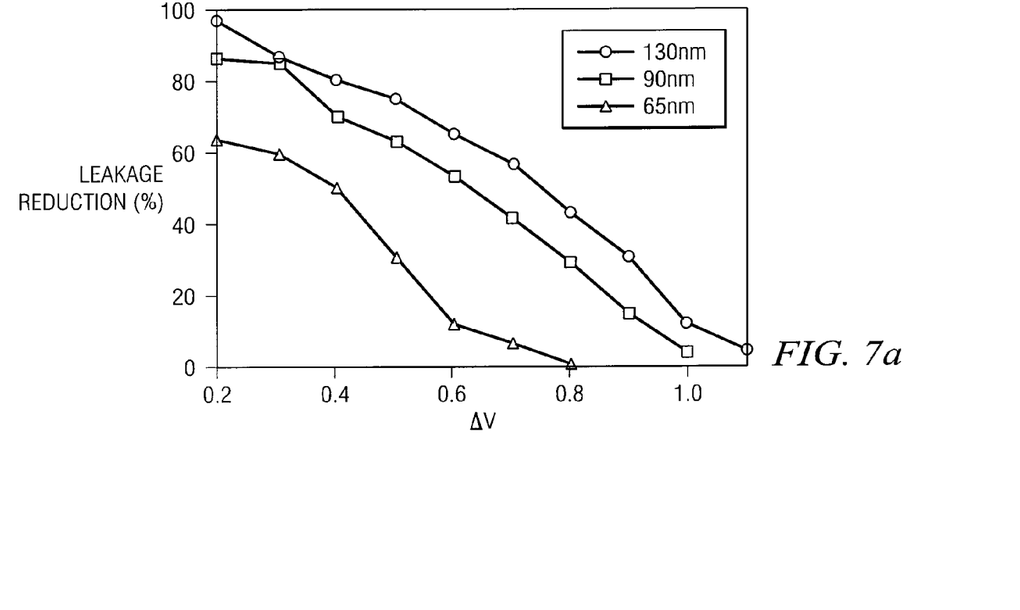
FIG. 7a shows example cell leakage current reduction of a PG-gated SRAM cell compared to a gated-ground cell.
Figure 7B:
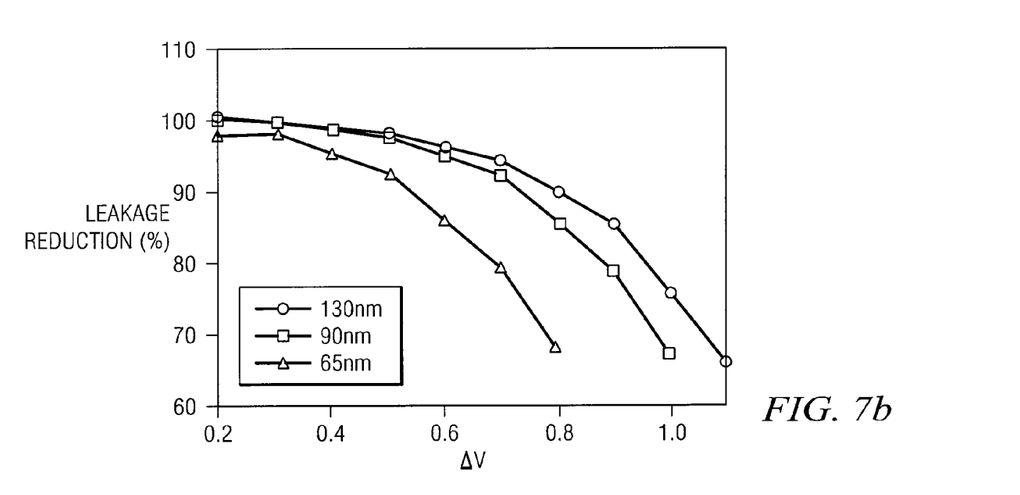
FIG. 7b shows example cell leakage current reduction of a PG-gated SRAM cell compared to a gated-power supply cell.

Example results of simulations performed on a PG-gated SRAM cell are shown in FIGS. 7a and 7b. FIG. 7a shows the cell leakage current savings for a PG-gated cell compared to a G-gated cell for different values of the voltage difference ΔV and for different sizes of technology nodes (130 nm, 90 nm, and 65 nm). FIG. 7b shows the cell leakage current reduction of a PG-gated cell compared to a P-gated cell for different values of the voltage difference ΔV and for different sizes of technology nodes.

Figure 8A:
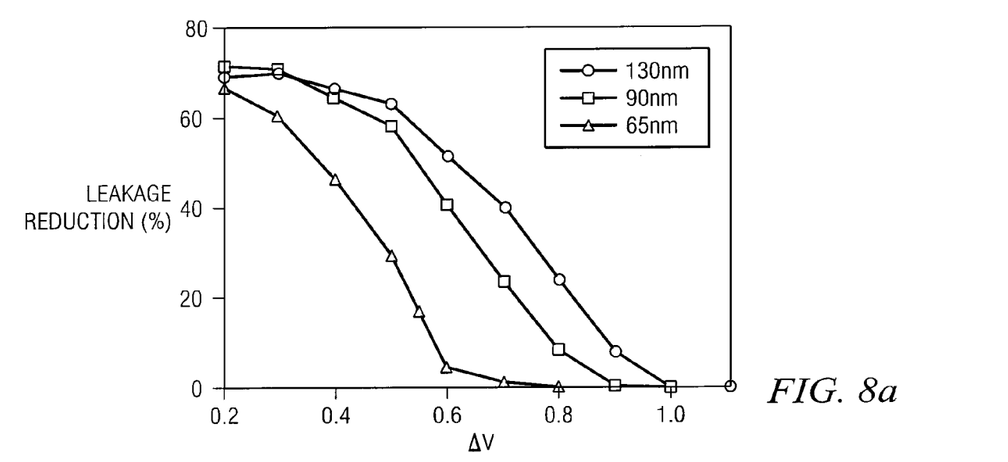
FIG. 8a shows example power reduction of a PG-gated SRAM cell compared to a gated-ground cell.
Figure 8B:
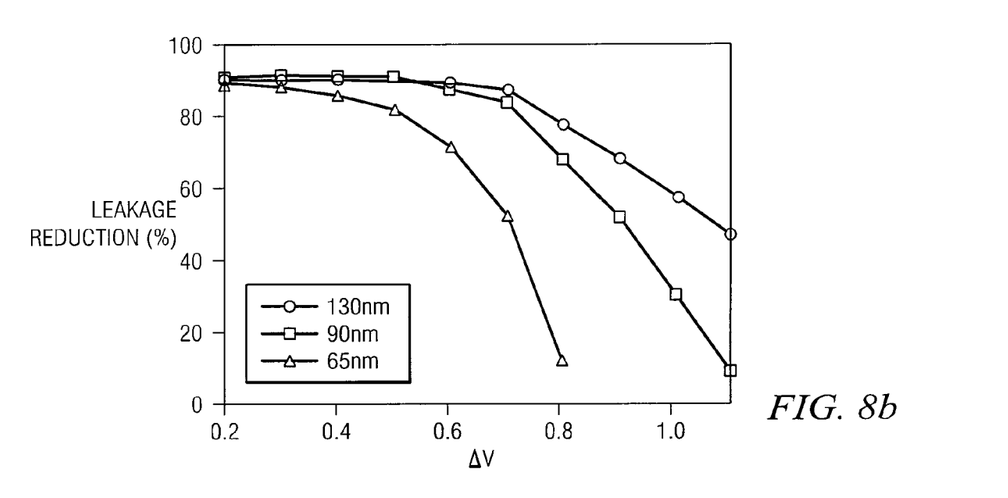
FIG. 8b shows example power reduction of a PG-gated SRAM cell compared to a gated-power supply cell.

FIGS. 8a and 8b show an example leakage current reduction of a PG-gated cell compared to G-gated and P-gated cells, respectively, for different values of the voltage difference ΔV in different technology nodes when the efficiencies of voltage converters are considered. Notice that the same voltage difference ΔV in each comparison (PG-gated versus G-gated or P-gated) ensures that hold static noise margin is the same. From FIGS. 8a and 8b one can see that despite the overhead of DC-DC converters used to generate $V_G$ and $V_P$, the efficiency of a PG-gated cell compared to P- and G-gated cells is quite high, especially when the voltage difference ΔV≦0.5 which is greater than the data retention voltage.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A method of forming a memory cell, comprising
    for a PG-gated memory cell comprising a first transistor coupled between a supply voltage and a supply rail of the cell, and a second transistor coupled between a ground and a ground rail of the cell, wherein a virtual supply voltage resides at the supply rail and a virtual ground voltage resides at the ground rail;
    establishing a value of a voltage difference between the supply rail and the ground rail, wherein the voltage difference is equal to a difference between the virtual supply voltage and the virtual ground voltage;
    determining values of the virtual supply voltage and the virtual ground voltage such that a total leakage current for the cell is minimized.

2. The method of claim 1, wherein the PG-gated memory cell comprises a static random access memory cell.

3. The method of claim 1, wherein the first transistor comprises a PMOS transistor.

4. The method of claim 1, wherein the second transistor comprises an NMOS transistor.

5. The method of claim 1, wherein determining the values of the virtual supply voltage and the virtual ground voltage comprises:
applying a selected external voltage VP, which is different from the supply voltage, to the supply rail; and
applying a selected external voltage VG, which is different from the ground, to the ground rail;
wherein the external voltage VP and the external voltage VG are selected to minimize leakage current in the memory cell.

6. The method of claim 5, further comprising dynamically adjusting the value of at least one of the external voltages VP and VG during operation of the memory cell.

7. The method of claim 1, further comprising determining at least one of a channel width or length, a threshold voltage or a gate oxide thickness of the first or the second transistor based at least in part on the determined values of the virtual supply voltage and/or the virtual ground voltage.

8. The method of claim 1, further comprising determining each of a channel width or length, a threshold voltage and a gate oxide thickness of the first transistor and the second transistor based at least in part on the determined values of the virtual supply voltage and the virtual ground voltage.

9. The method of claim 5, wherein at least one of the values of the external voltages is generated by a DC-DC converter and wherein the value of the at least one of the virtual supply voltage and the virtual ground voltage is determined by considering an efficiency of the DC-DC converter.

10. The method of claim 1, wherein the values of the virtual supply voltage and virtual ground voltage are at least partially determined based on at least one of the values of random intra-die variations of the transistor.

11. The method of claim 1, wherein the values of the virtual supply voltage and virtual ground voltage are at least partially determined according to a temperature or temperature variation of the memory cell.

12. The method of claim 1, wherein the values of the virtual supply voltage and the virtual ground voltage are selected to reduce the impact of process or temperature variation.

13. The method of claim 1, wherein the values of the virtual supply voltage and the virtual ground voltage are selected to minimize variation in the cell's leakage current.

14. The method of claim 1, wherein the values of the virtual supply voltage and the virtual ground voltage are selected by considering a weighted function of the expected value and the variance of leakage current of the cell in the presence of temperature or process variations.

15. A method of forming a memory cell, comprising
coupling a first sleep transistor between a supply rail of a memory cell and a node operable to accept a supply voltage;
coupling a second sleep transistor between a ground rail of the cell and a node operable to accept a ground; and
forming at least one of the first and the second sleep transistor to have a channel width or length, a threshold voltage, or a gate oxide thickness selected to minimize a total leakage current in the cell, wherein the threshold voltage of at least one of the first and the second sleep transistors is at least partially determined based on at least one of the values of random intra-die variations of the transistor.

16. The method of claim 15, wherein the cell comprises a static random access memory cell.

17. The method of claim 15, wherein the first sleep transistor comprises a channel width or length, a threshold voltage, and a gate oxide thickness selected to minimize a total leakage current in the cell, and wherein the second sleep transistor comprises a channel width or length, a threshold voltage, and a gate oxide thickness selected to minimize a total leakage current in the cell.

18. The method of claim 15, wherein the first sleep transistor comprises a PMOS transistor.

19. The method of claim 15, wherein the second sleep transistor comprises an NMOS transistor.

20. The method of claim 15, wherein at least one of the first and the second sleep transistors is controlled by an address decoder.

21. The method of claim 15, wherein at least one of the values of the supply voltage and the ground is generated by a DC-DC converter and wherein the value of the at least one of the virtual supply voltage and the virtual ground voltage is determined by considering an efficiency of the DC-DC converter.

22. The method of claim 15, wherein the values of the virtual supply voltage and virtual ground voltage are at least partially determined according to a temperature or temperature variation of the memory cell.

23. A PG-gated memory cell, comprising:
a first sleep transistor coupled between a supply rail of a memory cell and a node operable to accept a supply voltage;
a second sleep transistor coupled between a ground rail of the cell and a node operable to accept a ground;
wherein the values of a virtual supply voltage and a virtual ground voltage are selected such that a total leakage current for the cell is minimized; and
wherein the threshold voltage of at least one of the first and the second sleep transistors is at least partially determined based on at least one of the values of random intra-die variations of the transistor.

24. The PG-gated memory cell of claim 23, wherein the memory cell comprises a static random access memory cell.

25. The cell of claim 23, wherein the first sleep transistor comprises a channel width or length, a threshold voltage, or a gate oxide thickness selected to minimize a total leakage current in the cell, and wherein the second sleep transistor comprises a channel width or length, a threshold voltage, or a gate oxide thickness selected to minimize a total leakage current in the cell.

26. The cell of claim 23, wherein the first sleep transistor comprises a PMOS transistor.

27. The cell of claim 23, wherein the second sleep transistor comprises an NMOS transistor.

28. The cell of claim 23, wherein at least one of the first and the second sleep transistor comprises a channel width or length, a threshold voltage or a gate oxide thickness selected to minimize a total leakage current in the cell.

29. The cell of claim 23, wherein:
a first external voltage VP, which is different from the supply voltage, can be selectively applied to the supply rail; and
a second external voltage VG, which is different from the ground, can be selectively applied to the ground rail; and
wherein the external voltage VP and the external voltage VG are selected to minimize leakage current in the memory cell.

30. The cell of claim 29, wherein at least one of the external voltages VP and VG can be dynamically adjusted during operation of the memory cell.

31. The cell of claim 29, wherein at least one of the values of the external voltages is generated by a DC-DC converter and wherein the value of the at least one of the virtual supply voltage and the virtual ground voltage is determined by considering an efficiency of the DC-DC converter.

32. The cell of claim 23, wherein the values of the virtual supply voltage and virtual ground voltage are at least partially determined according to a temperature or temperature variation of the memory cell.

33. The cell of claim 23, wherein the values of the virtual supply voltage and the virtual ground voltage are selected to reduce the impact of process or temperature variation.

34. The cell of claim 23, wherein the values of the virtual supply voltage and the virtual ground voltage are selected to minimize variation in the cell's leakage current.

35. The cell of claim 23, wherein the values of the virtual supply voltage and the virtual ground voltage are selected by considering a weighted function of the expected value and the variance of leakage current of the cell in the presence of temperature or process variations.

* * * * *

UNITED STATES PATENT AND TRADEMARK OFFICE
CERTIFICATE OF CORRECTION

PATENT NO. : 7,447,101 B2
APPLICATION NO. : 11/615422
DATED : November 4, 2008
INVENTOR(S) : Farzan Fallah et al.

It is certified that error appears in the above-identified patent and that said Letters Patent is hereby corrected as shown below:

Col. 8, Ln. 7: After "$\Delta L=$" delete "$\alpha_{\mathit{eff}}$" and insert -- $\Delta L = \alpha_{N_{\mathit{eff}}}$ --;

Col. 8, Ln. 62: After "min" delete "Pcell $(V_p, V_c)$" and insert -- $E[\text{Pcell}(V_p, V_c)]$ --;

Col. 9, Ln. 47: After "fluctuations of" delete "those" and insert -- these --.

Signed and Sealed this

Thirteenth Day of October, 2009

David J. Kappos
*Director of the United States Patent and Trademark Office*